(12) United States Patent
Wang et al.

(10) Patent No.: US 12,457,897 B2
(45) Date of Patent: Oct. 28, 2025

(54) RECEPTOR MATERIAL, SYNTHESIS METHOD AND USE THEREOF

(71) Applicant: SOUTHERN UNIVERSITY OF SCIENCE AND TECHNOLOGY, Guangdong (CN)

(72) Inventors: Xingzhu Wang, Guangdong (CN); Zhixin Liu, Guangdong (CN); Baomin Xu, Guangdong (CN)

(73) Assignee: SOUTHERN UNIVERSITY OF SCIENCE AND TECHNOLOGY, Shenzhen (CN)

( * ) Notice: Subject to any disclaimer, the term of this patent is extended or adjusted under 35 U.S.C. 154(b) by 0 days.

(21) Appl. No.: 18/623,301

(22) Filed: Apr. 1, 2024

(65) Prior Publication Data
US 2024/0334824 A1 Oct. 3, 2024

(30) Foreign Application Priority Data
Mar. 30, 2023 (CN) .......................... 202310324472.1

(51) Int. Cl.
*H10K 85/60* (2023.01)
*C07D 495/22* (2006.01)
*H10K 30/50* (2023.01)

(52) U.S. Cl.
CPC ......... *H10K 85/657* (2023.02); *C07D 495/22* (2013.01); *H10K 85/626* (2023.02); *H10K 30/50* (2023.02)

(58) Field of Classification Search
CPC .... H10K 85/657; H10K 85/626; H10K 30/50; C07D 495/22
See application file for complete search history.

(56) References Cited

U.S. PATENT DOCUMENTS

2014/0246665 A1\* 9/2014 Lang .................... H10K 50/841
257/40
2015/0263285 A1\* 9/2015 Zhou ..................... H10K 30/81
438/82

(Continued)

FOREIGN PATENT DOCUMENTS

CN  107011361 A  8/2017
CN  109180637 A  1/2019
(Continued)

OTHER PUBLICATIONS

Yanan Shi "Small reorganization energy acceptors enable low energy losses in non-fullerene organic solar cells" Nature Communications | (2022) 13:3256 (Year: 2022).\*

(Continued)

*Primary Examiner* — Michael Y Sun
(74) *Attorney, Agent, or Firm* — MYERS WOLIN, LLC

(57) ABSTRACT

A receptor material, a synthesis method and use thereof is disclosed. The synthesis method of the receptor material includes: S1, reacting the compound shown in a formula I with LiAlH$_4$ to obtain a compound shown in a formula II; S2, reacting the compound shown in the formula II with 1,10-phenanthroline-5,6-dione to obtain a compound shown in a formula III; S3, reacting the compound shown in the formula III with phosphorus oxychloride and N,N-dimethylformamide to obtain a compound shown in a formula IV; and S4, reacting the compound shown in the formula IV with (5,6-dihalo-3-oxo-2,3-dihydro-1H-inden-1-ylidene)malononitrile. The receptor material provided by the present disclosure can effectively improve the open-circuit voltage and photoelectric conversion efficiency of organic photovoltaics cells including the receptor material. The present disclosure further provides an organic photovoltaic cell including the (Continued)

above receptor material and a method for preparing the organic photovoltaic cell.

3 Claims, 2 Drawing Sheets

(56) References Cited

U.S. PATENT DOCUMENTS

| | | |
|---|---|---|
| 2021/0288267 A1 | 9/2021 | Forrest et al. |
| 2023/0406861 A1* | 12/2023 | Pashazadeh ......... H10K 85/654 |

FOREIGN PATENT DOCUMENTS

| | | | |
|---|---|---|---|
| CN | 110218216 A | | 9/2019 |
| CN | 110256460 A | | 9/2019 |
| CN | 110372721 A | | 10/2019 |
| CN | 112552313 A | | 3/2021 |
| CN | 114181229 A | * | 3/2022 |
| CN | 114380843 A | | 4/2022 |
| CN | 115028647 A | | 9/2022 |
| CN | 115466270 A | | 12/2022 |
| WO | 2022/033993 A1 | | 2/2022 |

OTHER PUBLICATIONS

Jinhua Gao "Over 19.2% Efficiency of Organic Solar Cells Enabled by Precisely Tuning the Charge Transfer State Via Donor Alloy Strategy" Adv. Sci. Sep. 2022, 2203606 (Year: 2022).*

Seongwon Yoon "High-performance scalable organic photovoltaics with high thickness tolerance from 1 cm2 to above 50 cm2" Joule 6, 2406-2422, 2022 Elsevier Inc (Year: 2022).*

First Search Report issued by the China National Intellectual Property Administration for Chinese Patent Application No. 202310324472.1, mailed on Apr. 23, 2023, with an English translation.

Notification to grant patent right for invention issued by the China National Intellectual Property Administration for Chinese Patent Application No. 202310324472.1, dated May 12, 2023.

* cited by examiner

RECEPTOR MATERIAL, SYNTHESIS METHOD AND USE THEREOF

CROSS-REFERENCE TO THE RELATED APPLICATION

This application claims priority under 35 U.S.C. 119 from Chinese Patent Application No. 202310324472.1, filed on Mar. 30, 2023, the contents of which are incorporated by reference herein.

TECHNICAL FIELD

The present disclosure relates to the technical field of organic optoelectronics, and in particular to a receptor material, a synthesis method and use thereof.

BACKGROUND

Energy is an important factor that determines human survival and social development. Because fossil energy, as the main function of social life at present, is non-renewable and has limited reserves in a short period of time, it is urgent to develop new energy sources. Solar energy has become a new energy topic that scientists focus on today because of its convenience, safety, intelligence, inexhaustible and many other advantages. Organic photovoltaic cells (OPVs) can convert solar energy into electrical energy, and have the advantages of light weight, adjustable color and roll-to-roll printing production, etc. Therefore, the preparation of inexpensive, efficient, large-area OPVs has always been the goal pursued by people, and has attracted extensive attention in academic and industrial cycles around the world.

With the iterative upgrade of high-efficiency photovoltaic materials and technologies such as interface engineering, solvent engineering and additive engineering, etc., bulk heterojunction (BHJ) OPVs of polymer donors and non-fullerene small molecular receptors (SMAs) show great potentials in reducing costs and improving efficiency. Although OPVs have great potentials, there are still several critical issues that need to be overcome in order to achieve its large-scale commercial application. First of all, currently, the effective area of all high-efficiency OPVs is less than 1 $cm^2$, which is far from meeting the needs of commercialization of photovoltaic modules; secondly, among several factors affecting the photoelectric conversion efficiency (PCE) of large-area OPVs, the filling factor (FF) of OPVs has a particularly obvious impact on the ability of generating, transporting, and collecting charges in the battery. Moreover, the large-area OPVs usually has a low FF and an open-circuit voltage, which limits the improvement of photoelectric conversion efficiency of OPVs. In order to improve the comprehensive performance of large-area OPVs, there are technologies to improve the PCE of bulk heterojunction (BHJ) type large-area OPVs through strategies such as light absorption complementation and energy level matching, etc. However, compared with other types of large-area photovoltaic cells, the FF of large-area OPV devices is still low, which cannot further improve the energy conversion efficiency of the device.

The factors limiting the FF, open-circuit voltage, and PCE of large-area OPVs include the selection of donors and receptors in the active layer, and the matching between receptors and donors.

Therefore, it is an important breakthrough for improving the FF and PCE of OPVs to develop a receptor that can increase the open-circuit voltage of large-area OPVs and prepare e an OPV battery including this receptor.

SUMMARY

The present disclosure aims to solve at least one of the technical problems existing in the prior art. To this end, according to the present disclosure, a receptor material that can effectively improve the open-circuit voltage and photoelectric conversion efficiency of an organic photovoltaic cell including the receptor material is provided.

The present disclosure further provides a synthesis method of the above receptor material.

The present disclosure further provides an organic photovoltaic cell including the above receptor material.

The present disclosure further provides a method for preparing the above organic photovoltaic cell.

According to an embodiment of a first aspect of the present disclosure, a receptor material (hereafter referred to as the "DTP-4X") is provided, and the receptor material includes a structure formula shown as below:

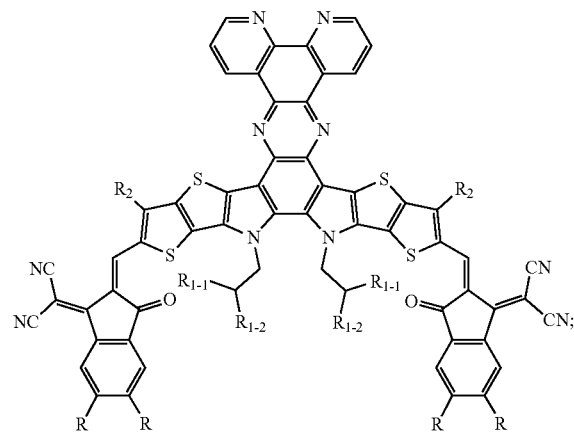

wherein R is a halogen atom;
$R_{1-1}$ and $R_{1-2}$ are one of $C_2$-$C_4$ alkyl group; and
$R_2$ is $C_{10}$-$C_{12}$ alkyl group.

The receptor material according to the embodiment of the present disclosure has at least the following beneficial effects.

The present disclosure provides an active layer formed by combining receptor materials with traditional donors, which has stronger absorption in the ultraviolet-visible region (600-900 nm), smaller Lowest Unoccupied Molecular Orbital (LUMO) energy level difference with common donors, and better matching therewith, which is conducive to regulating the microscopic film morphology of the active layer, and is thus expected to effectively improve the energy conversion efficiency of large-area organic photovoltaic cell devices.

According to some embodiments of the present disclosure, R in the above structure formula of the receptor material is a chlorine atom or a fluorine atom.

When R in the above structure formula is a chlorine atom, the receptor material is referred to as DTP-4Cl.

When R in the above structure formula is a fluorine atom, the receptor material is referred to as DTP-4F.

According to some embodiments of the present disclosure, $R_2$ in the above structure formula of the receptor material is $C_{11}$ alkyl, i.e. —$C_{11}H_{23}$.

According to some embodiments of the present disclosure, $R_{1-1}$ in the above structure formula of the receptor material is $C_4$ alkyl, i.e., —$C_4H_9$.

According to some embodiments of the present disclosure, $R_{1-2}$ in the above structure formula of the receptor material is $C_2$ alkyl, i.e., —$C_2H_5$.

According to some embodiments of the present disclosure, the receptor material has a structural formula shown as below:

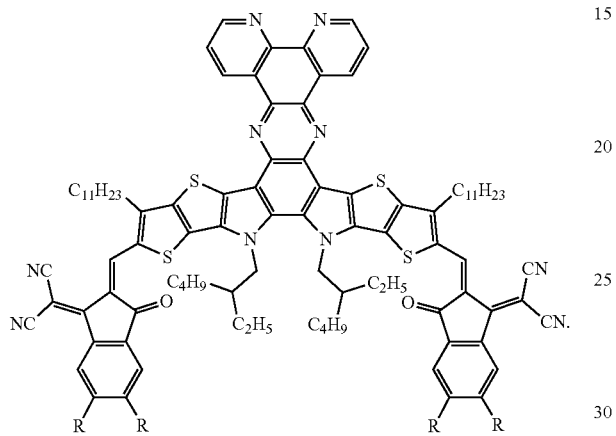

According to some embodiments of the present disclosure, the receptor material has a color of blue.

According to some embodiments of the present disclosure, the receptor material is in a state of solid.

According to some embodiments of the present disclosure, the receptor material has a Highest Occupied Molecular Orbital (HOMO) energy level of about −5.66 eV.

According to some embodiments of the present disclosure, the receptor material has a LUMO energy level of about −3.98 eV.

According to an embodiment of a second aspect of the present disclosure, a synthesis method of the receptor material is provided, and the synthesis method includes the following steps:

S1, reacting a compound shown in a formula I with LiAlH$_4$ (CAS: 16853-85-3) to obtain a compound shown in a formula II;

S2, reacting the compound shown in the formula II with 1,10-phenanthroline-5,6-dione (CAS: 27318-90-7) to obtain a compound shown in a formula III;

S3, reacting the compound shown in the formula III with phosphorus oxychloride (CAS: 10025-87-3) and N,N-dimethylformamide (CAS: 68-12-2) to obtain a compound shown in a formula IV; and S4, reacting the compound shown in the formula IV with (5,6-dihalo-3-oxo-2,3-dihydro-1H-inden-1-ylidene) malononitrile;

Formula I

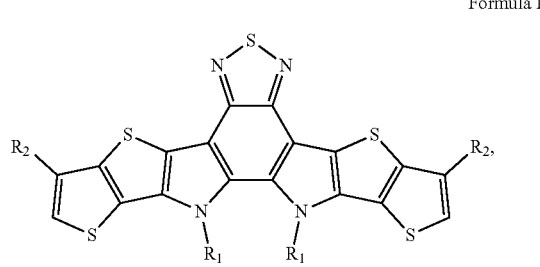

Formula II

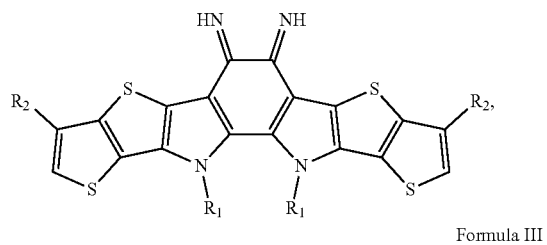

Formula III

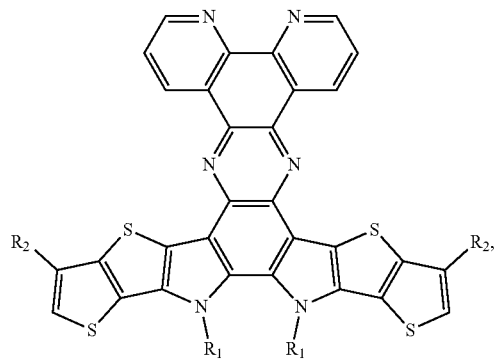

Formula IV

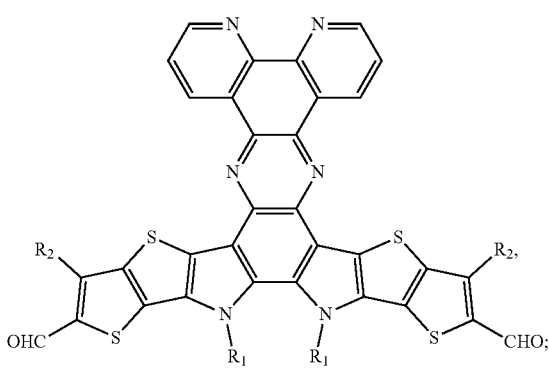

wherein $R_1$ represents

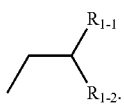

The synthesis method according to the embodiment of the present disclosure has at least the following beneficial effects.

The synthesis method provided by the present disclosure has mild reaction conditions, simple operation, and includes an environmentally friendly solvent for preparing, which is easy to realize expandable production and can effectively reduce the production costs of the receptor material and the organic photovoltaic cell including the receptor material.

According to some embodiments of the present disclosure, in step S1, a molar ratio of the compound shown in the formula I to LiAlH$_4$ is 1:(2.5-3.5). For example, it may be specifically about 1:3.

According to some embodiments of the present disclosure, in step S1, the reaction is conducted at room temperature. For example, it may be specifically 15-40° C.

According to some embodiments of the present disclosure, in step S1, the reaction is conducted for 10-14 h. For example, it may be specifically about 12 h.

According to some embodiments of the present disclosure, in step S1, the reaction is performed in an organic solvent. The organic solvent used may be specifically tetrahydrofuran (THF, CAS: 109-99-9).

According to some embodiments of the present disclosure, in a reaction system of step S1, a feeding concentration of the compound shown in the formula I is 0.05-1 mol/L. For example, it may be specifically about 0.051 mol/L.

Unless otherwise stated, the feeding concentration in the present disclosure refers to a concentration at which no reaction occurs.

According to some embodiments of the present disclosure, in step S1, the reaction is conducted in a protective atmosphere. The protective atmosphere includes at least one of nitrogen and inert gas.

According to some embodiments of the present disclosure, the step S1 further includes removing the solvent after the reaction is completed. The method for removing the solvent includes rotary evaporation.

According to some embodiments of the present disclosure, a molar ratio of 1,10-phenanthroline-5,6-dione in step S2 to the compound shown in the formula I in step S1 is 1:(2-2.5). For example, it may be specifically about 1:2.

According to some embodiments of the present disclosure, in step S2, the reaction is conducted in an acetic acid environment. A dosage ratio of 1,10-phenanthroline-5,6-dione to the acetic acid is 0.18-0.22 mmol/mL. For example, it may be specifically about 0.2 mmol/mL.

According to some embodiments of the present disclosure, in step S2, the reaction is conducted for 10-14 h; for example, it may be specifically about 12 h.

According to some embodiments of the present disclosure, in step S2, the reaction is conducted at 110-120° C. For example, it may be specifically about 118° C.

According to some embodiments of the present disclosure, the step S2 further includes purifying the compound shown in the formula III after the reaction is completed.

A purification method of the compound shown in the formula III includes extraction and silica gel column chromatography carried out in sequence; an extraction agent used in the extraction is dichlormethane; a step for removing the dichlormethane in an extraction phase is further included between the extraction and the silica gel column chromatography, and the method for removing the dichlormethane includes rotary evaporation.

According to some embodiments of the present disclosure, in step S3, a dosage ratio of the compound shown in the formula III to N,N-dimethylformamide is 0.01-0.02 mmol/mL. For example, it may be specifically about 0.018 mmol/mL.

According to some embodiments of the present disclosure, in step S3, a dosage ratio of the compound shown in the formula III to phosphorus oxychloride is 0.28-0.32 mmol/mL. For example, it may be specifically about 0.3 mmol/mL.

According to some embodiments of the present disclosure, in step S3, the reaction includes: first mixing the compound shown in the formula III with N,N-dimethylformamide, and then mixing with phosphorus oxychloride, and subjecting a resulting mixture to a first stage of stirring and a second stage of stirring sequentially.

The mixing and the first stage of stirring are conducted at a temperature of −5° C. to 1° C. For example, they may be specifically about 0° C.

The first stage of stirring is conducted for 0.5-1.5 h. For example, it may be specifically about 1 h.

The second stage of stirring is conducted at a temperature of 80-100° C. For example, it may be specifically about 90° C.

The second stage of stirring is conducted for 8-14 h. For example, it may be specifically about 10 h.

Therefore, by regulating and controlling the feeding sequence of N,N-dimethylformamide and phosphorus oxychloride, and the two stages of stirring at different temperatures, the reactions with N,N-dimethylformamide and phosphorus oxychloride may be completed in sequence to generate a strongly electrophilic Vielsmeier intermediate, after which the intermediate undergoes an electrophilic substitution reaction with the compound shown in the formula III.

According to some embodiments of the present disclosure, the step S3 further includes purifying the compound shown in the formula IV after the reaction is completed.

Wherein, a purification method of the compound shown in formula IV includes extraction and silica gel column chromatography carried out in sequence; and an extraction agent used in the extraction is dichlormethane; a step for removing the dichlormethane in a extraction phase is further included between the extraction and the silica gel column chromatography, and the method for removing the dichlormethane includes rotary evaporation.

According to some embodiments of the present disclosure, in step S4, the (5,6-dihalo-3-oxo-2,3-dihydro-1H-inden-1-ylidene)malononitrile includes at least one of (5,6-difluoro-3-oxo-2,3-dihydro-1H-inden-1-ylidene)malononitrile (CAS: 2083617-82-5) and (5,6-dichloro-3-oxo-2,3-dihydro-1H-inden-1-ylidene)malononitrile (CAS: 2197167-50-1).

According to some embodiments of the present disclosure, in step S4, a molar ratio of the compound shown in the formula IV to (5,6-dihalo-3-oxo-2,3-dihydro-1H-inden-1-ylidene)malononitrile is (0.3-0.35):1. For example, it may be specifically about 0.34:1.

According to some embodiments of the present disclosure, in step S4, the reaction is conducted in a solvent, and the solvent used includes chloroform.

A dosage ratio of the compound shown in the formula IV to the solvent is 6.5-7 mmol/L. For example, it may be specifically about 6.8 mmol/L.

According to some embodiments of the present disclosure, in step S4, the reaction is conducted under an action of a catalyst. The catalyst includes pyridine. Whereby, it can provide a slightly alkaline reaction condition.

A dosage ratio of the compound shown in the formula IV to the catalyst is 0.13-0.14 mmol/mL. For example, it may be specifically about 0.136 mmol/mL.

According to some embodiments of the present disclosure, in step S4, the reaction is conducted in a protective atmosphere, and the protective atmosphere used includes an inert atmosphere.

According to some embodiments of the present disclosure, in step S4, the reaction includes dissolving the compound shown in the formula IV and (5,6-dihalo-3-oxo-2,3-dihydro-1H-inden-1-ylidene) malononitrile in chloroform, and adding pyridine to a resulting mixture under stirring to allow reaction under reflux.

The reaction under reflux is conducted for 10-14 h. For example, it may be specifically about 12 h.

According to some embodiments of the present disclosure, the step S4 further includes purifying the receptor material after the reaction is completed.

The purification of the receptor material includes mixing a reacted mixture in step S4 with methanol to precipitate a crude product of the receptor material; and the purification of the receptor material further includes subjecting the crude product to column chromatography separation for purification.

According to some embodiments of the present disclosure, in the synthesis method, a yield of the receptor material is greater than or equal to 63%.

According to an embodiment of a third aspect of the present disclosure, an organic photovoltaic cell is provided. The organic photovoltaic cell includes a first electrode, a hole transport layer, an active layer, an electron transport layer and a second electrode that are stacked in sequence; and the active layer includes a donor PM6 (CAS: 1802013-83-7), the receptor material and a receptor L8-BO (CAS: 2668341-40-8).

The organic photovoltaic cell according to the embodiment of the present disclosure has at least the following beneficial effects.

The organic photovoltaic cell provided by the present disclosure may significantly increase the open-circuit voltage of the obtained organic photovoltaic cell due to the synergistic cooperation between the receptor and the donor in the active layer, and ultimately improving its photoelectric conversion efficiency.

In the organic photovoltaic cell provided by the present disclosure, the prepared receptor material is used. The raw materials for preparing the receptor material are inexpensive, and the method for preparing is simple. That is, the costs of the receptor material are low, thereby reducing the cost of the organic photovoltaic cell, which is of great significance in promoting the commercialization process of the large-area organic photovoltaic cells.

According to some embodiments of the present disclosure, an area of the organic photovoltaic cell is about 1 cm$^2$. For example, the organic photovoltaic cell can be a square with a side length of greater than or equal to 1 cm.

According to some embodiments of the present disclosure, the organic photovoltaic cell further includes a substrate disposed on a side surface of the first electrode away from the second electrode.

The material of the substrate includes glass.

Industrially, for convenience, the first electrode is usually plated on the substrate to form an intermediate component before use; and the intermediate component includes ITO glass, wherein an ITO coating is the first electrode.

According to some embodiments of the present disclosure, the material of the hole transport layer includes PEDOT:PSS.

According to some embodiments of the present disclosure, the hole transport layer has a thickness of 30-50 nm.

According to some embodiments of the present disclosure, the active layer has a thickness of 80-120 nm.

According to some embodiments of the present disclosure, a mass ratio of the donor PM6 to the receptor material (DTP-4X) is 1:(0.1-0.3).

According to some embodiments of the present disclosure, a mass ratio of the donor PM6 to the receptor L8-BO is 1:(1.2-1.6).

According to some embodiments of the present disclosure, the material of the electron transport layer includes PNDIT-F3N (CAS: 1800206-46-5).

According to some embodiments of the present disclosure, the electron transport layer has a thickness of 10-20 nm.

According to some embodiments of the present disclosure, the material of the second electrode includes Ag.

According to some embodiments of the present disclosure, the second electrode has a thickness of 100-150 nm.

According to an embodiment of a fourth aspect of the present disclosure, a preparation method of the organic photovoltaic cell is provided. The preparation method includes sequentially arranging the first electrode, the hole transport layer, the active layer, the electron transport layer and the second electrode on a substrate.

The preparation method according to the embodiment of the present disclosure has at least the following beneficial effects.

the preparation method provided by the present disclosure is simple and has good compatibility with the preparation of traditional organic photovoltaic cells, and thus there is no need to add additional equipment.

According to some embodiments of the present disclosure, the preparation method further includes pretreatmenting the intermediate components formed by the substrate and the first electrode before arranging the hole transport layer.

The pretreatment includes sequentially cleaning the intermediate components with a glass cleaning solution, ultra-pure water and isopropyl alcohol.

A method for the cleaning includes ultrasonic cleaning; and for cleaning with each of the detergents, the cleaning lasts for approximately 30 min.

In order to improve the wettability of the glass cleaning solution to the intermediate components and remove large-area dirt attached to the intermediate components, the pretreatment further includes wiping the intermediate components with absolute ethanol before cleaning the intermediate components with the glass cleaning solution.

In order to further improve the cleanliness of the intermediate components, the cleaning further includes cleaning the intermediate components with absolute ethanol again after the cleaning with isopropyl alcohol.

According to some embodiments of the present disclosure, the pretreatment further includes drying and deep cleaning after the cleaning;
 a method for the drying includes blow drying with nitrogen;
 a method for the drying includes drying in a constant temperature drying oven;
 a temperature of the constant temperature drying oven is 65-75° C. For example, it may be specifically about 70° C.

The instruments used for deep cleaning include at least one of an Ultraviolet-ozone cleaning machine and a Plasma cleaning machine; and the deep cleaning is conducted for 5-30 min. For example, it may be specifically about 10 min.

According to some embodiments of the present disclosure, the raw materials for preparing the hole transport layer include a PEDOT:PSS aqueous solution. The PEDOT:PSS aqueous solution is stored at a temperature of 0-10° C. For example, it may be specifically about 5° C.

According to some embodiments of the present disclosure, a concentration of the PEDOT:PSS aqueous solution is 1.3 wt %-1.7 wt %. For example, it may be specifically about 1.5 wt %.

According to some embodiments of the present disclosure, a method for arranging the hole transport layer includes static spin coating.

In the static spin coating for arranging the hole transport layer: a rotation speed is 4,000-5,000 r/min (revolutions per minute), for example, it may be specifically about 4500 r/min; the static spin coating is conducted for 20-40 s, for example, it may be specifically about 30 s.

According to some embodiments of the present disclosure, a dosage of the PEDOT:PSS aqueous solution is 0.06-0.1 mL/cm$^2$ based on the area of the organic photovoltaic cell. For example, it may be specifically about 0.08 mL/cm$^2$.

According to some embodiments of the present disclosure, the method for arranging the hole transport layer further includes performing annealing after the static spin coating.

A temperature for annealing the hole transport layer is 140-160° C. For example, it may be specifically about 150° C.

The annealing the hole transport layer is conducted for 10-15 min.

According to some embodiments of the present disclosure, a method for arranging the active layer includes coating an organic solution comprising the donor PM6, the receptor material and the receptor L8-BO to a surface of the hole transport layer, and then annealing the hole transport layer.

According to some embodiments of the present disclosure, in the organic solution, a sum of a concentrations of the donor PM6, a concentrations of the receptor material and a concentrations of the receptor L8-BO is 15-18 mg/mL. For example, it may be specifically about 17.6 mg/mL.

According to some embodiments of the present disclosure, a solvent of the organic solution includes at least one of toluene, o-xylene, tetrahydrofuran and trimethylbenzene. For example, it may be specifically trimethylbenzene.

According to some embodiments of the present disclosure, a boiling point of the organic solution is 110-160° C.

Therefore, according to the present disclosure, an environmentally friendly solvent with a high-boiling point is used to replace a chloroform solvent with a low boiling point, low vapor pressure and hypertoxicity, providing an environmentally friendly processing basis for the preparation of large-area organic photovoltaic cell devices.

According to some embodiments of the present disclosure, a method for preparing the organic solution includes mixing the donor PM6, the receptor material, the receptor L8-BO, and the solvent and then stirring a resulting mixture under dark conditions for 12-36 h. For example, it may be specifically about 24 h.

According to some embodiments of the present disclosure, a method for coating the active layer includes spin coating.

The coating of the active layer is conducted in a protective atmosphere including at least one of nitrogen and inert gas.

A rotation speed of spin coating for coating the active layer is 3,000-4,000 r/min. For example, it may be specifically about 3,500 r/min.

The spin coating for coating the active layer is conducted for 30-40 s. For example, it may be specifically about 33 s.

According to some embodiments of the present disclosure, in the coating of the active layer, a dosage of the organic solution is 1.5-1.8 µL/cm$^2$. For example, it may be specifically about 1.6 L/cm$^2$.

According to some embodiments of the present disclosure, the active layer is annealed at a temperature of 80-100° C.

According to some embodiments of the present disclosure, the active layer is annealed for 8-15 min. For example, it may be specifically about 10 min.

According to some embodiments of the present disclosure, a method for arranging the electron transport layer includes coating a solution of PNDIT-F3N on a surface of the active layer, and then drying the active layer.

In the solution of PNDIT-F3N, a concentration of PNDIT-F3N is 1-2 mg/mL.

In the solution of PNDIT-F3N, a solvent is a mixture of methanol and acetic acid; and in the mixture, a volume fraction of acetic acid is 0.4% to 0.6%. For example, it may be specifically about 0.5%.

According to some embodiments of the present disclosure, in the coating of the electron transport layer, a dosage of the solution of PNDIT-F3N is 3-3.5 µL/cm$^2$. For example, it may be specifically about 3.2 µL/cm$^2$.

According to some embodiments of the present disclosure, the electron transport layer is coated by spin coating, wherein spin coating is conducted at a rotation speed of 2,000-3,000 for 30-40 s.

The electron transport layer is dried by natural drying, that is, it is performed without interference from temperature and air flow.

According to some embodiments of the present disclosure, a method for arranging the second electrode includes evaporation.

A vacuum degree of the evaporation is less than or equal to $10^{-6}$ Torr.

A evaporation rate is 5 to 10 Angstroms/s. It specifically refers to a thickness of evaporation per second.

Unless specially explained, the actual meaning of "about" in the present disclosure means that the allowable error is within the range of ±2%. For example, about 100 actually means 100±2%×100.

Unless specially explained, "-" in the present disclosure means that the endpoint values are included. For example, "2-3" means that the endpoint values 2 and 3 are included.

Additional features and advantages of the present disclosure will be set forth in the description below, and partially become apparent from the description, or may be understood by implementing the present disclosure.

BRIEF DESCRIPTION OF DRAWINGS

The above and/or additional aspects and advantages of the present disclosure will become apparent and readily understood from the description of the embodiments taken in conjunction with the accompanying drawings below, wherein.

REFERENCE NUMERALS

Figure 1:
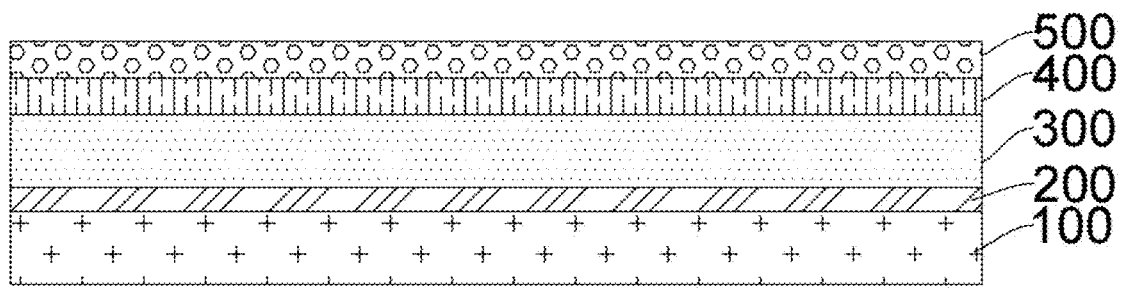
FIG. 1 shows a schematic structural diagram of the organic photovoltaic cell prepared in Example 3 of the present disclosure.

ITO glass 100, hole transport layer 200, active layer 300, electron transport layer 400, and second electrode 500.

DETAILED DESCRIPTION

Embodiments of the present disclosure will be described in detail below, examples of which are illustrated in the accompanying drawings, wherein the same or similar reference numerals throughout the present disclosure represent the same or similar elements or elements with the same or similar functions. The embodiments described below with reference to the accompanying drawings are exemplary and are only used to explain the present disclosure and cannot be understood as limiting the present disclosure.

In the description of the present disclosure, if the "first", "second", etc. are described, they are only used for the purpose of distinguishing technical features, and cannot be understood as indicating or implying the relative importance or implicitly indicating the number of indicated technical features or implicitly indicating the sequence relationship of the indicated technical features.

In the description of the present disclosure, it should be understood that the orientation descriptions, such as the orientation or positional relationships indicated by "up", and "down", etc. are based on the orientation or positional relationships as shown in the accompanying drawings, and are only for the convenience of describing the present disclosure and simplifying the description, rather than indicating or implying that the device or element referred to must have a specific orientation, be constructed and operated in a specific orientation, and therefore cannot be construed as a limitation of the present disclosure.

In the description of the present disclosure, it should be noted that, unless otherwise clearly defined, words such as "arranging", "installing", and "connecting", etc., should be understood in a broad sense. Those skilled in the art can reasonably determine the specific meaning of the above words in the present disclosure in combination with the specific content of the technical solution.

Unless specially explained, the temperature in the specific embodiment is room temperature, i.e., in the range of 20-30° C., and will not have a significant impact on the test results.

Example 1

A receptor material was prepared in this example, the synthesis process was as shown in the scheme below, and the specific steps were as follows:
S1, In a 250 mL round-bottom flask, the compound shown in the formula I (purchased from Nanjing Zhiyan Technology Co., Ltd., China) (2 g, 2.06 mmol) and LiAlH$_4$ (0.24 g, 6.17 mmol) were weighed and reacted in a THF solution (40 mL) under the protection of an inert gas with stirring for 12 h. After the reaction was completed, the solvent was dried through rotary evaporation to obtain the compound represented by the formula II.
S2, 1,10-phenanthroline-5,6-dione (0.86 g, 4.12 mmol) was directly added to the round-bottom flask in step S1, and acetic acid solution (20 mL) was added to react at about 118° C. for 12 h, and then the react product was extracted with dichloromethane, and subjected to rotary evaporation for drying the solvent to obtain a crude product, and then the crude product was separated and purified with silica gel column chromatography to obtain a solid product, i.e., the compound represented by the formula III (with a mass of 1.23 g, and a yield of 50%). The test results of the compound shown in the formula III were as follows: HRMS (m/z, MALDI): Calc. for C68H88N6S4, [M+H]+: 1117.73, found: 1116.63, $^1$H NMR (400 MHz, CDCl3), δ (ppm): 8.80 (m, 2H), 8.84 (m, 2H), 7.03 (s, 2H), 5.50-5.44 (m, 2H), 4.70-4.61 (m, 4H), 2.87-2.83 (t, 4H), 2.09-2.06 (t, 2H), 1.89-1.85 (t, 4H), 1.55-1.54 (d, 6H), 1.38-1.11 (m, 36H), 1.10-0.86 (m, 24H), 0.64-0.60 (m, 12H). Thus, it was confirmed that the compound shown in the formula III was prepared and obtained.
S3, The compound shown in the formula III (0.50 g, 0.45 mmol) and anhydrous N,N-dimethylformamide (25 mL) were added to a 100 mL three-necked flask, and then phosphorus oxychloride (1.5 mL) was added after stirring the mixture at 0° C. for a few minutes. The reaction mixture was increased to a temperature of 90° C. after being stirred at 0° C. for 1 h, and then stirred overnight (about 10 h), cooled to room temperature, extracted with dichloromethane, subjected to rotary evaporation for drying the solvent, and to separating and purifying with silica gel column chromatography to obtain the compound shown in the formula IV (with a mass of 0.43 g, a yield of 82%). The test results of the product obtained in this step were as follows: HRMS (m/z, MALDI): Calc. for: C$_{69}$H$_{103}$N$_3$O$_2$S$_5$, [M+H]+: 1166.90, found: 1165.67. $^1$H NMR (400 MHz, CDCl3), δ (ppm): 8.80 (m, 2H), 8.84 (m, 2H), 7.03 (s, 2H), 6.90 (s, 2H), 4.70-4.61 (m, 4H), 2.87-2.83 (t, 4H), 2.09-2.06 (t, 2H), 1.89-1.85 (t, 4H), 1.55-1.54 (d, 6H), 1.38-1.11 (m, 36H), 1.10-0.86 (m, 24H), 0.64-0.60 (m, 12H). Thus, it was confirmed that the compound shown in the formula IV was prepared and obtained.
S4, In a 100 mL round-bottom flask, the compound shown in the formula IV (400 mg, 0.34 mmol) and (5,6-difluoro-3-oxo-2,3-dihydro-1H-inden-1-ylidene)malononitrile (389.2 mg, 1.01 mmol) were dissolved in 50 mL chloroform, and gas replacement was carried out for three times under the protection of argon and then 2.5 mL pyridine was slowly added while stirring. Then, the mixture was reacted at refluxing under the protection of argon for 12 h, cooled to room temperature, poured into 300 mL anhydrous methanol and then subjected to suction filtering to obtain a crude product of the receptor material, and then the crude product of the receptor material was separated and purified with silica gel column chromatography to obtain a dark blue solid (with a mass of 345.66 mg, a yield of 63%). The analysis results of the product obtained in this step were as follows: HRMS (m/z, MALDI): Calc. for: C$_{94}$H$_{92}$F$_4$N$_{10}$O$_2$S$_4$, [M+H]+: 1598.07, found: 1597.63. $^1$H NMR (400 MHz, CDCl3), δ (ppm): 9.84 (s, 2H), 8.80 (m, 2H), 8.84 (m, 2H), 7.63 (m, 2H), 7.13 (s, 4H), 4.70-4.61 (m, 4H) 2.87-2.83 (t, 4H), 2.09-2.06 (t, 2H), 1.89-1.85 (t, 4H), 1.55-1.54 (d, 6H), 1.38-1.11 (m, 36H), 1.10-0.86 (m, 24H), 0.64-0.60 (m, 12H). Thus, it was confirmed that the expected receptor material in this example was prepared and obtained.

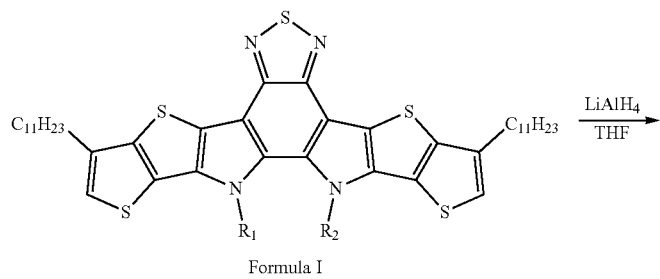
Formula I
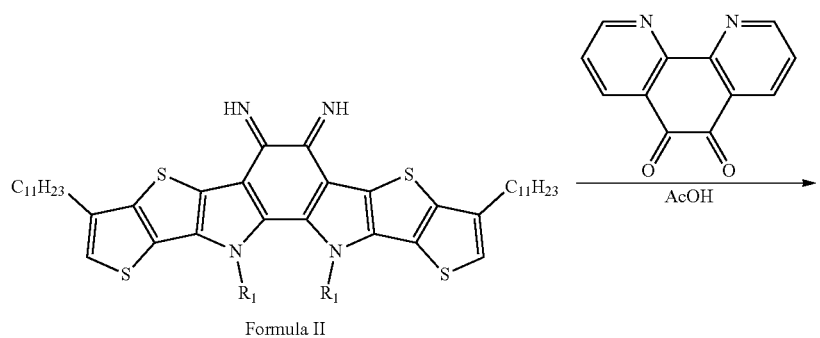
Formula II
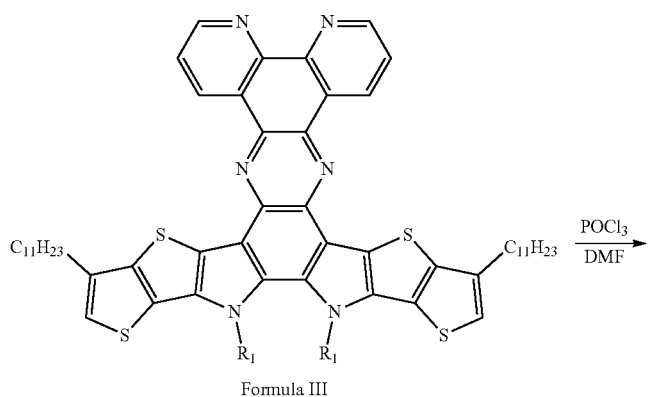
Formula III
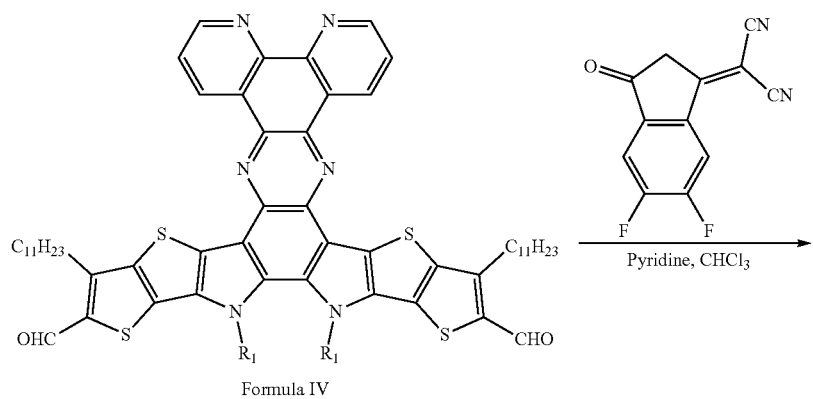
Formula IV -continued

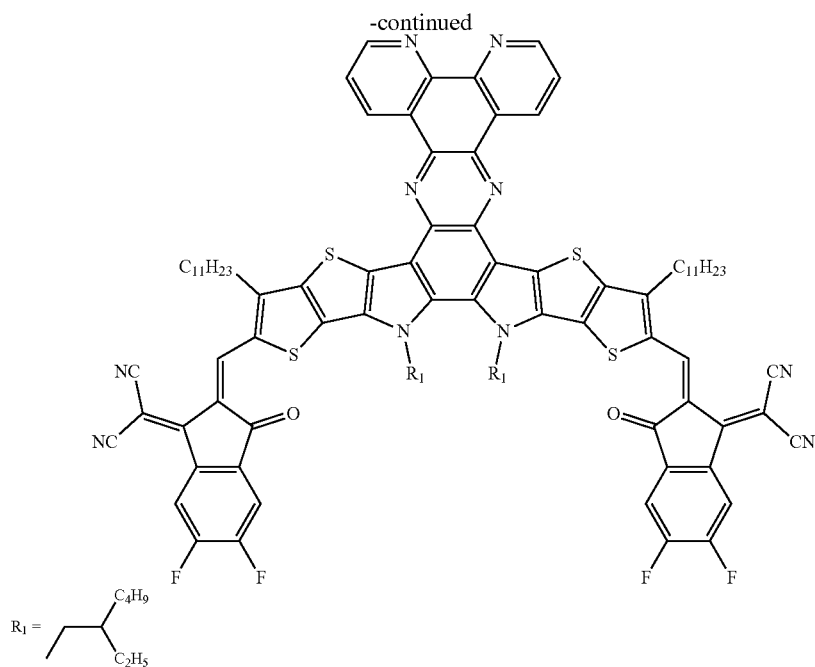

Example 2

A receptor material was prepared in this example. The difference in the synthesis process from Example 1 lied in that:

in step S4, (5,6-difluoro-3-oxo-2,3-dihydro-1H-inden-1-ylidene)malononitrile of Example 1 was replaced with the equivalent amount of (5,6-dichloro-3-oxo-2,3-dihydro-1H-inden-1-ylidene)malononitrile.

The mass of the obtained receptor material was 387.66 mg, the yield was about 68%.

The test results of the receptor material were as follows: HRMS (m/z, MALDI): Calc. for: $C_{94}H_{92}C_{14}N_{10}O_2S_4$, [M+H]+: 1663.88, found: 1662.63. $^1$H NMR (400 MHz, CDCl3), δ (ppm): 9.76 (s, 2H), 8.74 (m, 2H), 8.84 (m, 2H), 7.63 (m, 2H), 7.13 (s, 4H), 4.70-4.61 (m, 4H) 2.87-2.83 (t, 4H), 2.09-2.06 (t, 2H), 1.89-1.85 (t, 4H), 1.55-1.54 (d, 6H), 1.38-1.11 (m, 36H), 1.10-0.86 (m, 24H), 0.64-0.60 (m, 12H). Thus, it was confirmed that the expected receptor material in this example was prepared and obtained.

Example 3

An organic photovoltaic cell was prepared in this example, the structural diagram of which was as shown in FIG. 1, and the specific steps were as follows:

D1, Pretreatment of the Intermediate Component (ITO Glass 100):

The commercial ITO glass with an area of 5 cm×5 cm was wiped with a dust-free cloth moistened with absolute ethanol and put into a glass container equipped with an ITO glass holder, and then cleaned with glass cleaning solution, ultra-pure water, isopropyl alcohol and absolute ethanol in sequence under ultrasonication, wherein each cleaning under ultrasonication was conducted for about 30 minutes, and then the cleaned ITO glass was blow dried with a nitrogen gun, cleaned in a Ultraviolet-ozone cleaning machine for 30 minutes and then placed in a petri dish for later use.

D2, Arrangement of the Hole Transport Layer 200:

Under room temperature and air conditions, the ITO glass was placed in the right middle of the suction cup of the spin coater and fixed by turning on the vacuum pump, and the impurities on the surface of the ITO glass was blew away by a rubber suction bulb. The 5° C. PEDOT:PSS aqueous solution with a concentration of approximately 1.5 wt % was overspread on the surface of ITO glass with a 2 mL syringe, and then the spin coating was conducted by using the spin coater, wherein the rotation speed parameter of the spin coater was set to 4,500 r/min, and the rotation time parameter was set to 30 s. After the spin coating was completed, the vacuum pump was turned off, and the ITO glass spin coated with the PEDOT:PSS film was removed and then placed on a heating stage at a temperature of 150° C. for thermally annealing 10 minutes to obtain the hole transport layer of a material of PEDOT:PSS.

D3, Arrangement of the Active Layer 300:

Under the condition of a glove box filled with nitrogen, the PM6, L8-BO (purchased from Solarmer Organic Optoelectronics Technology (Beijing) Co., Ltd., China) and DTP-4F (the receptor material prepared in Example 1) at a mass ratio of 1:1.2:0.1 were dissolved in trimethylbenzene to prepare an organic solution with a concentration of 17.6 mg/mL, and then stirred under the dark condition for 24 h with a magneton therein.

The components obtained in step D2 were placed in the right middle of the suction cup of the spin coater and fixed by turning on the vacuum pump (one side of the hole transport layer facing up), and the impurities on the surface of the hole transport layer was blew away by a rubber suction bulb. The spin coating was conducted by using the spin coater, wherein the rotation speed parameter of the spin coater was set to 3,500 r/min, and the rotation time parameter was set to 33 s. 40 μL of the organic solution of the active layer was sucked up and dropped in the right middle of the hole transport layer by using a pipette when the spinning coating time remained 30 s. After the spin coating was completed, the vacuum pump was turned off, and the obtained component was placed on a heating stage at a temperature of 100° C. for thermally annealing 10 minutes to obtain an active layer made of the donor PM6, the receptor material (DTP-4F) obtained in Example 1 and the receptor L8-BO. The donor PM6 and the receptor L8-BO used in this step had structures as shown below:

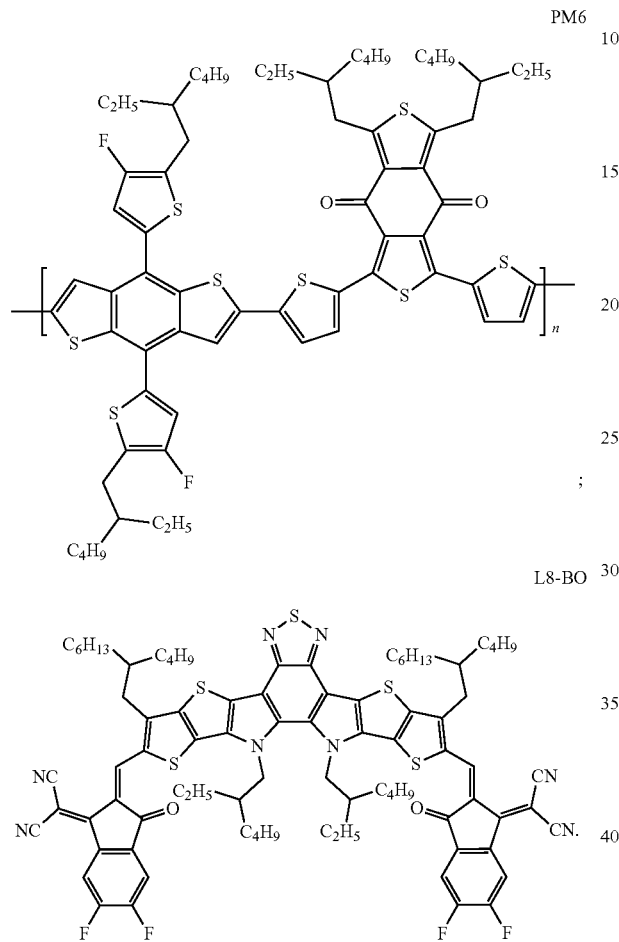

D4, Arrangement of the Electron Transport Layer 400:

Under room temperature and air conditions, the PDNIT-F3N material was prepared into a solution of PDNIT-F3N with a concentration of 1 mg/mL, wherein the solvent of this solution was a mixture of methanol and acetic acid, and a volume concentration of acetic acid in the solvent was 0.5%.

Under the condition of a glove box filled with nitrogen, the component obtained in step D3 was placed in the right middle of the suction cup of the spin coater and fixed by turning on the vacuum pump (one side of the active layer facing up), and the impurities on the surface of the active layer was blew away by a rubber suction bulb. The spin coating was conducted by using the spin coater, wherein the rotation speed parameter of the spin coater was set to 2,000 r/min, and the rotation time parameter was set to 33 s. 80 μL of the solution of PDNIT-F3N was sucked up and dropped in the right middle of the active layer by using a pipette when the spinning coating time remained 30 s. After the spin coating was completed, the vacuum pump was turned off, and the obtained component was the electron transport layer made of PDNIT-F3N material.

D5, Arrangement of the Second Electrode 500:

A silver electrode with a thickness of 100 nm was evaporated on one side of the electron transport layer of the component obtained in step D4 using a vacuum evaporation method. During the evaporation process, the vacuum degree parameter was preferably $10^{-6}$ Torr, and the evaporation rate was 10 angstroms/s.

Example 4

An organic photovoltaic cell was prepared in this example, and the difference from Example 3 specifically lied in that: the receptor material DTP-4C$_1$ obtained in Example 2 was used to replace the receptor material DTP-4F from Example 1 in the active layer of Example 3.

Comparative Example 1

An organic photovoltaic cell was prepared in this comparative example, and the difference from Example 3 specifically lied in that: in this comparative example, the active layer did not include the receptor material prepared in Example 1. That is, the active layer was consisted of the donor PM6 and the receptor L8-BO.

Test Example

The performances of the organic photovoltaic cells prepared in Examples 3, 4 and Comparative example 1 were tested in this test example, specifically the current density curve and voltage curve were tested, and the results of open-circuit voltage, short-circuit current, filling factor and photoelectric conversion efficiency, etc., were obtained.

The test results show that the open-circuit voltage of the organic photovoltaic cell provided by the present disclosure is ≥0.89V, the filling factor is ≥70.65%, for example up to 73.03%, the photoelectric conversion efficiency is ≥15.04%, and even ≥15.59%. It is indicated that the organic photovoltaic cell comprising a self-made receptor material provided by the present disclosure may significantly increase the open-circuit voltage and the photoelectric conversion efficiency on the premise of increasing its area.

Figure 2:
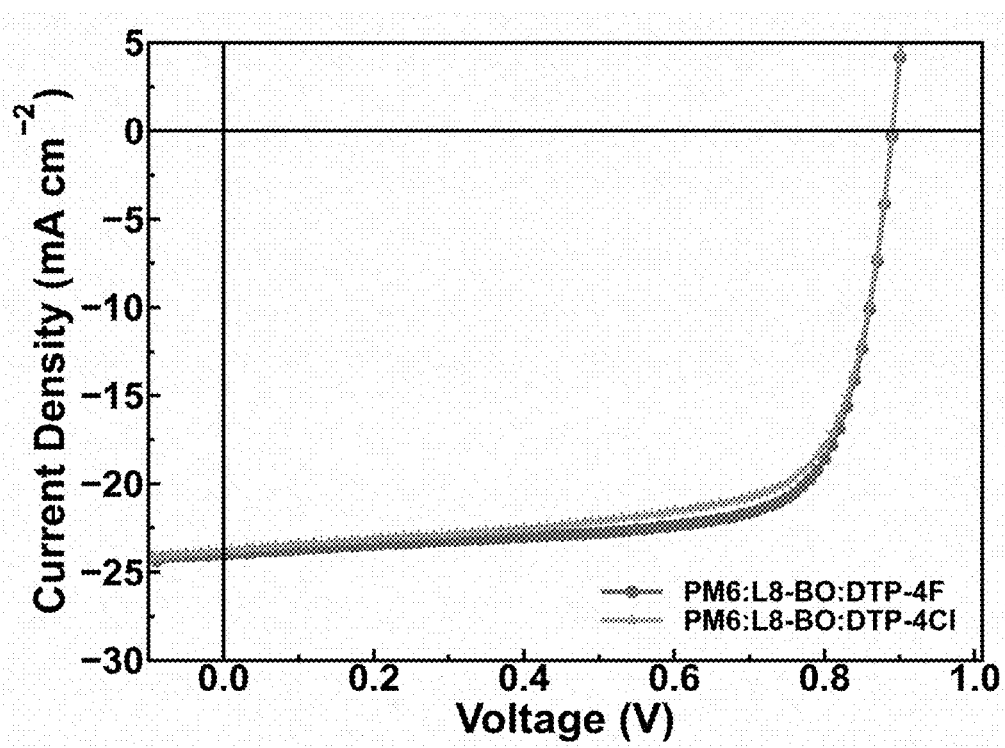
FIG. 2 shows a Current density-Voltage (J-V) graph of the organic photovoltaic cell prepared in Example 3 of the present disclosure.
Figure 3:
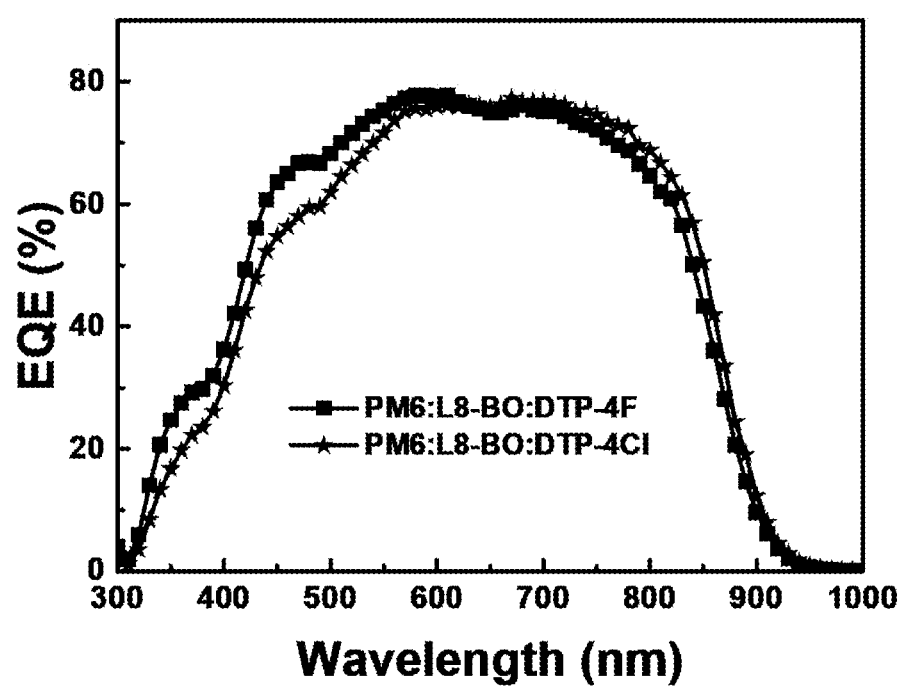
FIG. 3 shows an External Quantum Efficiency (EQE) graph of the organic photovoltaic cell prepared in Example 3 of the present disclosure.

The test results of the solar cells in Example 3 and Comparative example 1 are shown in Table 1 and FIGS. 2-3.

TABLE 1

Comparison of Performances of Organic Photovoltaic Cells Obtained in Examples 3 and 4 and Comparative Example 1

| | Open-circuit voltage ($V_{OC}$, V) | Short circuit current ($J_{SC}$, mA/cm$^2$) | Filling factor (FF, %) | Photoelectric conversion efficiency (PCE, %) |
|---|---|---|---|---|
| Example 3 | 0.89 | 23.97 | 73.03 | 15.59 |
| Example 4 | 0.89 | 23.78 | 70.65 | 15.04 |
| Comparative example 1 | 0.85 | 23.53 | 74.24 | 14.85 |

The results in Table 1 also indicate that since the organic photovoltaic cell provided by the present disclosure includes the receptor material prepared in Example 1, its open-circuit voltage and photoelectric conversion efficiency are significantly improved.

Further, from the comparison of the results in Table 1 (from the test in FIG. 2) and the integrated short-circuit current fitted in FIG. 3 (21.68 mA/cm² for Example 3 and 21.44 mA/cm² for Example 4), it can be seen that the error between the test value (Table 1) and the fitted value (FIG. 3) is within 5%, indicating that the organic photovoltaic cell provided by the present disclosure has a high degree of reliability, and it can be expected that it will be widely used in the field of new energy.

Although the examples of the present disclosure have been explained in detail above in conjunction with the accompanying drawings, the present disclosure is not limited thereto. Within the scope of knowledge possessed by those ordinarily skilled in the technical field to which it belongs, various variations can be made without departing from the objectives of the present disclosure.

The invention claimed is:

1. A preparation method of an organic photovoltaic cell, comprising sequentially arranging a first electrode, a hole transport layer, an active layer, an electron transport layer and a second electrode on a substrate;

wherein the organic photovoltaic cell comprises the first electrode, the hole transport layer, the active layer, the electron transport layer and the second electrode stacked in sequence;

wherein the active layer comprises a donor PM6, a receptor material and a receptor L8-BO, and the donor PM6 and the receptor L8-BO have structure formulas shown as below:

PM6

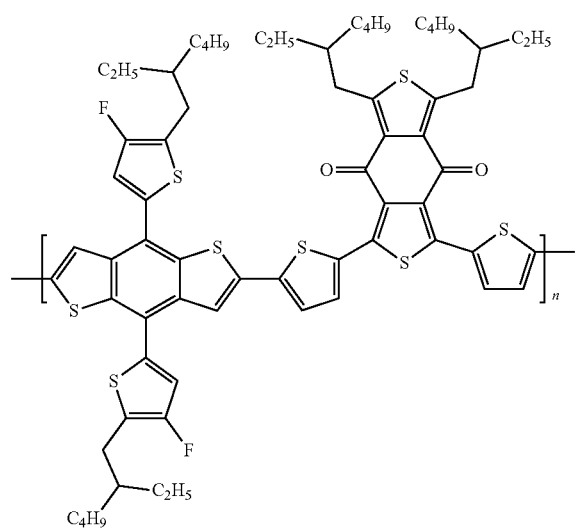

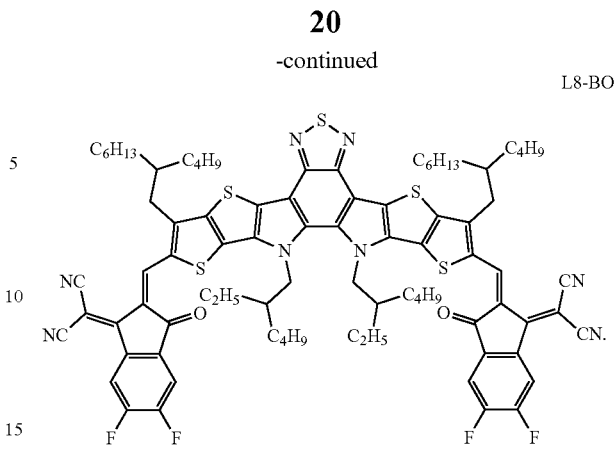

L8-BO wherein the receptor material comprises a structure formula shown as below;

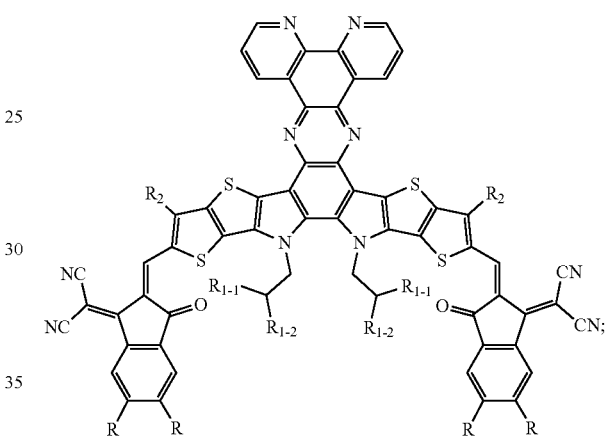

wherein:
R is a halogen atom;
$R_{1-1}$ and $R_{1-2}$ are one of $C_2$-$C_4$ alkyl group;
$R_2$ is $C_{10}$-$C_{12}$ alkyl group;
a mass ratio of the donor PM6 to the receptor material is 1:0.1 to 1:0.3;
a mass ratio of the donor PM6 to the receptor L8-BO is 1:1.2 to 1:1.6;
the active layer has a thickness of 80-120 nm; and
the organic photovoltaic cell has an area of about 25 cm².

2. The preparation method according to claim 1, wherein a method for arranging the active layer comprises coating an organic solution comprising the donor PM6, the receptor material and the receptor L8-BO to a surface of the hole transport layer, and annealing the hole transport layer.

3. The preparation method according to claim 2, wherein in the organic solution, a sum of a concentrations of the donor PM6, a concentrations of the receptor material and a concentrations of the receptor L8-BO is 15-18 mg/mL.

* * * * *